United States Patent [19]

Leuschner

[11] Patent Number: 4,724,471
[45] Date of Patent: Feb. 9, 1988

[54] ELECTROSTATIC DISCHARGE INPUT PROTECTION NETWORK

[75] Inventor: Horst Leuschner, Phoenix, Ariz.

[73] Assignee: SGS Semiconductor Corporation, Phoenix, Ariz.

[21] Appl. No.: 948,472

[22] Filed: Dec. 29, 1986

Related U.S. Application Data

[63] Continuation of Ser. No. 720,862, Apr. 8, 1985, abandoned.

[51] Int. Cl.⁴ .............. H01L 29/78; H01L 27/02; H01L 29/04; H01L 23/48
[52] U.S. Cl. .................. 357/23.13; 357/41; 357/51; 357/59; 357/65; 357/68; 357/71
[58] Field of Search .............. 357/23.13, 59, 65, 68, 357/23.1, 41, 51, 71

[56] References Cited

U.S. PATENT DOCUMENTS

| | | | |
|---|---|---|---|
| 3,335,340 | 8/1967 | Barson et al. | 357/51 |
| 3,609,470 | 9/1971 | Kuiper | 357/67 |
| 3,740,835 | 12/1973 | Duncan | 357/67 |
| 3,777,216 | 12/1973 | Armstrong | 357/23.13 |
| 4,291,322 | 9/1981 | Clemens et al. | 357/65 |
| 4,342,045 | 7/1982 | Kim | 357/23.13 |
| 4,509,067 | 4/1985 | Minami et al. | 357/51 |
| 4,541,002 | 9/1985 | Shimada | 357/23.13 |

OTHER PUBLICATIONS

F. Masuoka et al, "A New Mask ROM Cell Programmed by Through-Hole Using Double Polysilicon Technology", *Proceedings of the IEEE International Electron Devices Meeting* (1953) pp. 577-579.

J. K. Keller, "Protection of MOS Integrated Circuits from Destruction by Electrostatic Discharge", *Proceedings of the 1980 Electrical Overstress/Electrostatic Discharge Symposium*, pp. 73-80.

*Primary Examiner*—J. Carroll
*Attorney, Agent, or Firm*—M. David Shapiro

[57] ABSTRACT

An improved input network for MOS semiconductor devices intended to increase the device resistance to electrostatic discharge in the input circuit. A series of features comprising round and concentric round contacts and buried contacts, a layer of polycrystalline silicon disposed between the metal input contact and the N+ diffusion layer and enlarged metal contact areas are employed to reduce the tendency toward breakdown by reducing hot spots in the device.

6 Claims, 18 Drawing Figures

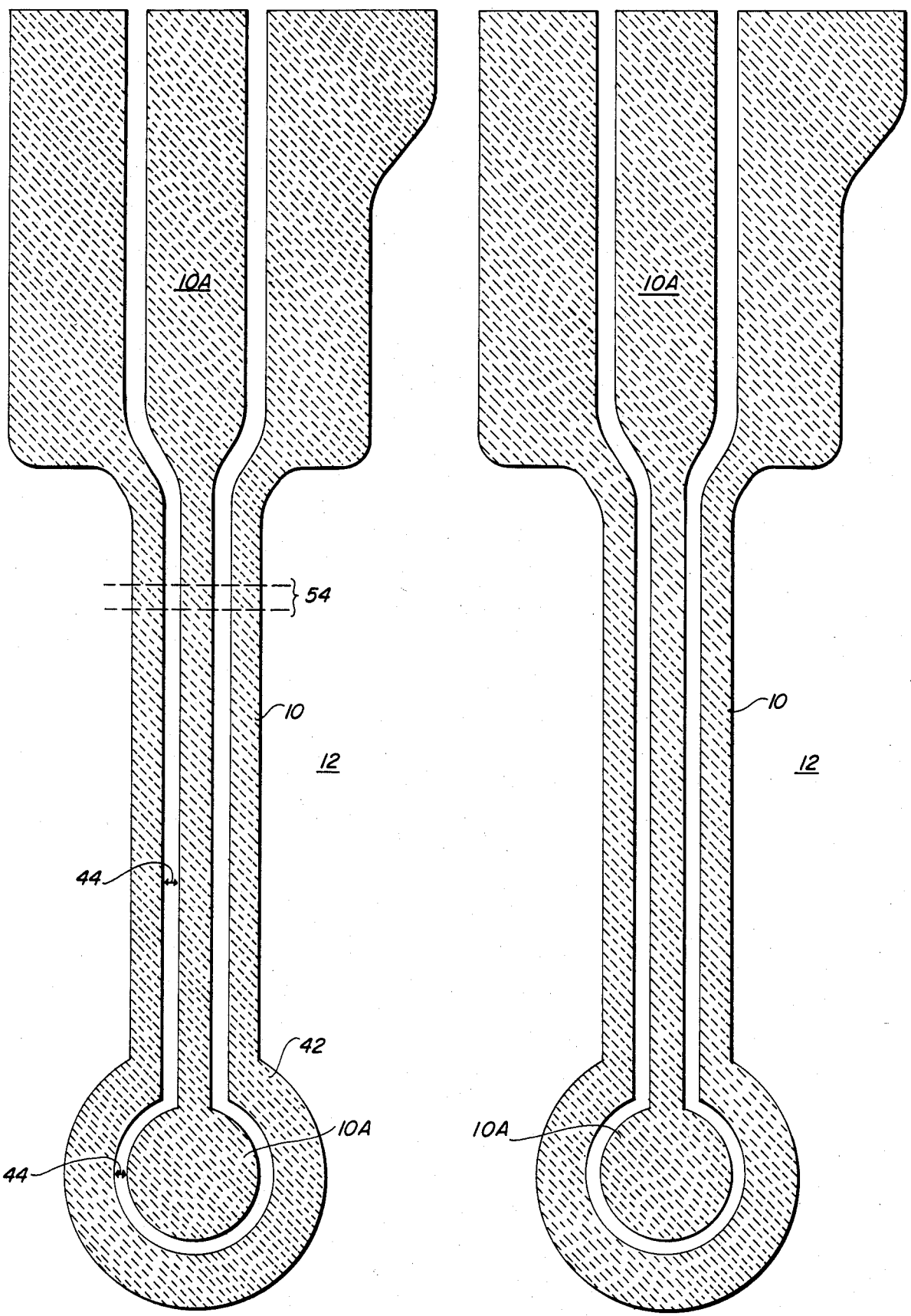
FIG_1A    FIG_2A

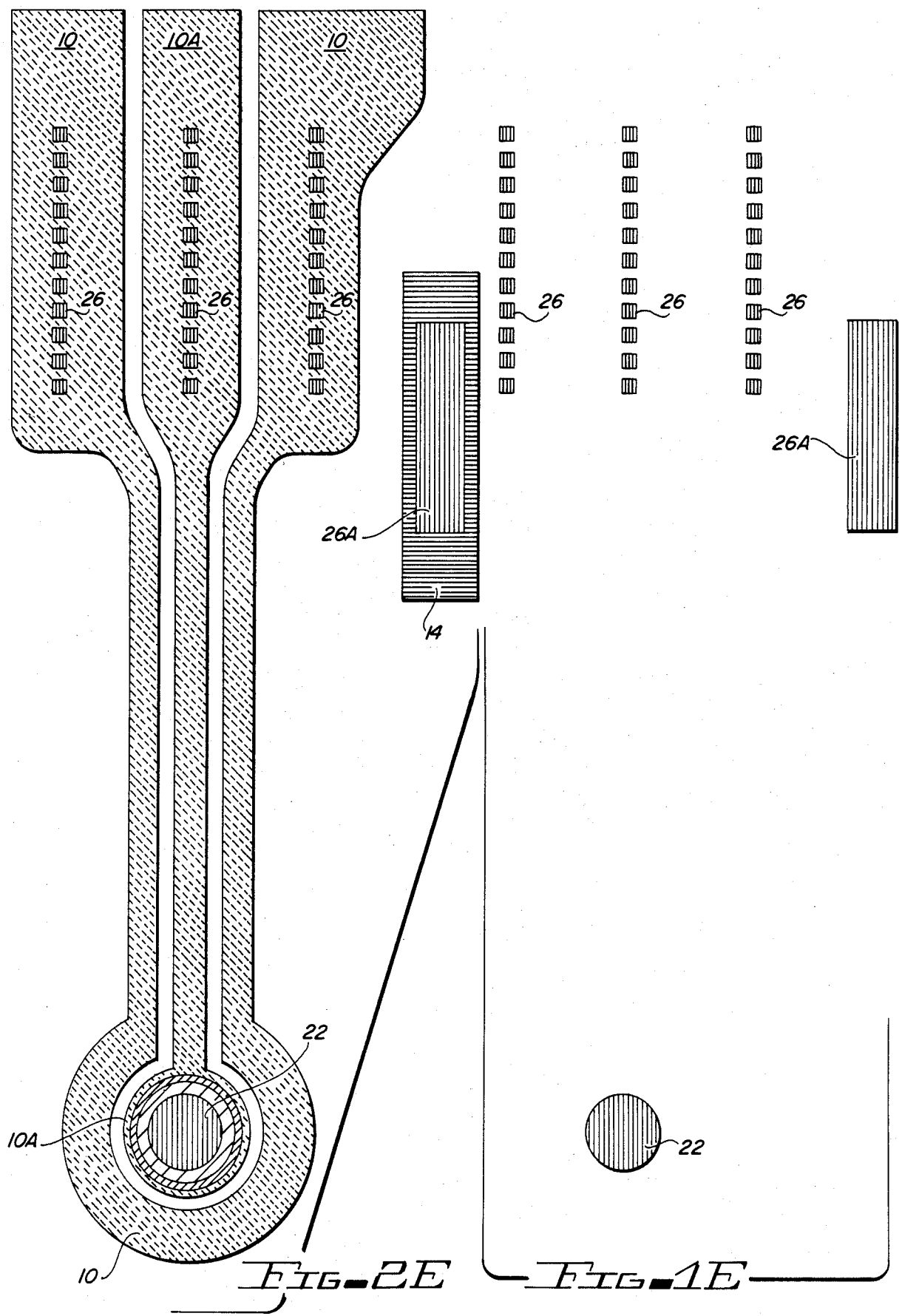

ELECTROSTATIC DISCHARGE INPUT PROTECTION NETWORK

This application is a continuation of application Ser. No. 720,862 filed Apr. 8, 1985 abandoned.

FIELD OF THE INVENTION

The invention relates to an improved protection network for preventing damage in an input circuit of an MOS semiconductor device, and to a gate electrode connected thereto, by an applied electrostatic discharge.

BACKGROUND OF THE INVENTION

It is well known that semiconductor junctions and especially the gate oxides of MOS transistors are easily damaged by reason of electrostatic discharge (ESD). The silicon dioxide ($SiO_2$) gate insulators typically have a thickness on the order of about 400 Angstroms. Breakdown potentials are on the order of from 20 to 50 volts. Where one or more pins of the device are exposed to an electrostatic potential which differs from the electrostatic potential already thereon, the ensuing discharge of energy may cause permanent damage to the input circuit of the device, either by excessive current density in avalanche breakdown, by gate oxide rupture or by gradual degradation due to the cumulative trapping of charges in the gate insulator. The capability of the device to withstand that discharge of energy may be quantified by means of an ESD test.

In such an ESD test, a capacitor, simulating the capacitance of the human body, is charged from a voltage supply to a predetermined voltage and then is discharged into the input pin of the device under test through a mercury wetted contact and a series current limiting resistor. Generally, the resistance value of such a resistor is in the range of between zero and 1500 ohms and the voltage supply may be on the order of from 500 to 2000 volts.

After such discharge, the device under test is checked for leakage at an applied voltage, representing a working voltage of, for example, five volts. The leakage in an undamaged device would not be expected to be more than, for example, one microampere. Typically, for an ESD test of this nature, U.S. industry standards would require the use of a 100 pF test capacitor discharged through mercury wetted contacts and a 1500 ohm series limiting resistor into the device input circuit pin or pad.

By accepted definition in this industry, a poorly protected MOS input circuit would be damaged by a potential of about 700 volts, an acceptable input circuit network would protect to potentials up to approximately 1500 volts and an input circuit considered to be very good would protect against potentials up to about 3000 volts. Because test equipment is not generally available to provide a 3000 volt test, it is common practice to provide, instead, a 200 pF test capacitor and, in that case, the aforementioned very good protective circuit might withstand 2000 volts or more.

In the past, the failure mechanism of greatest concern was rupture of the gate insulating oxide of the MOS device. This rupture occurred at approximately 50 volts with practically no current flow required. As a result, input circuits are commonly used which employ an RC network and/or some sort of gate clamping device; a gated diode or a field inversion transistor, either of which protects the MOS gate by breaking down in an avalanche mode or in the case of field inversion transistor by source/drain turn-on. In that case, failures are usually traced to a fatal failure of the protection circuit rather than the MOS device input gate. However, such catastropic failures in the input protection network are just as fatal to the device as a failure in the gate oxide insulator.

To illustrate the harsh conditions which prevail in MOS devices, one has only to consider that the input breakdown occurs in a normal MOS integrated circuit at between approximately 20 volts and 50 volts; the 20 volt failure threshold being a function of the gated diode or polysilicon field inversion transistor and the 50 volt failure threshold occurring in the N+/P junction of the MOS device. These breakdowns demonstrate a very low resistance for voltages higher than the threshold breakdown voltage of the protective circuit. Additionally, the high density breakdown current leads to secondary effects such as bipolar transistor action which further lowers the breakdown resistance.

It can be assumed, as a crude estimate, that the voltage at the input pin of the device under test is clamped at between 50 and 100 volts by the protective circuit. At the input side of the 1500 ohm series test resistor, the voltage, for good input protection, must be assumed to be equal to or more than 2000 volts. Hence, a conservative estimate of the momentary maximum current into the input pin is on the order of:

$(2000-100)V/1500\Omega = 1.26$ amperes.

Ideally, the specification for input protection should be set at the maximum voltage which could be applied prior to damage of the input circuit. Of course, the size of the test capacitor and series current limiting resistor must also be specified. Depending upon the specific protection circuit, the damage is caused either by the maximum (momentary) current density or by the total energy/charge dissipated, or by a combination of both. It is clear that the peak current density is controlled by the value of the series limiting resistor (whether part of the test circuit or internal to the chip); varying the capacitor voltage controls both peak current density and total dissipated energy, while variation of the capacitor size affects changes in the total energy only.

Thus it may be seen that by testing for the destructive limits of a given input protection circuit as a function of all three boundary conditions; capacitor voltage, capacitor value and series resistance; one can assess which of the failure modes is dominant. For example, if there is evidence of electromigration, the failure is probably due to excessive peak current density; if there is evidence of junction fusing by way of excessive joule heating of the junction, the failure is probably due to excessive total energy dissipated.

It must be noted that ESD occurs within approximately 100 nanoseconds of its application and that damage occurs within the first fractions of a nanosecond. Thus, due to the extremely fast rise times, even test fixture lead inductance has an effect on the test results. Additionally, it is difficult to predict the resistance values of the protection network and of the external wiring because of the skin effect due to fast rise times. It is clear that testing must be carefully controlled.

With 2000 volts or more at the input pin, avalanche breakdown is inevitable. The objective of an input protection circuit is not avoidance of the breakdown, but rather, survival of both the input gate oxide insulation and the protective circuit, without permanent damage to either. Avalanche breakdown is generally characterized by a negative temperature coefficient. In any preferred current (low resistance) path caused by the avalanche, high current density occurs. This creates a "hot spot" and the avalanche effect in the hot spot is increased even more by the positive feedback current characteristic due to the negative temperature coefficient; all of which causes still higher current and current density through the hot spot. The phenomena is well known as "thermal runaway". Excessive current density and/or temperature results in permanent damage in the hot spot.

Metal contact to silicon is made by depositing aluminum at elevated temperatures and alloying it with the silicon during subsequent heat treatment in a forming gas. The contact interface between silicon and aluminum is not planar, but rather, silicon is dissolved into aluminum at the interface and aluminum fills the voids left by the diffused silicon. These filled voids may be in the nature of metal spikes of aluminum which partially penetrate the N+ diffusion layer. In the worst case, the spike will extend all the way through the junction and create a short circuit to the P− substrate. (The aluminum, which is a P dopant, makes direct ohmic contact with the P− substrate and shorts the input to the substrate.) But even where the spike does not reach all the way to the substrate, the metal spike establishes a preferred current path deep in the diffusion layer and breakdown occurs from that point, in the path of lowest resistance. As the diffused layer is reduced in depth, this "spiking" effect is increased. Furthermore, with the increasing development of very large scale integrated circuits (VLSI), semiconductor junctions and gate insulations have become increasingly shallow in depth.

Where metal and buried contacts are configured with square or hard corners or with convex "points", there is a high electric field in these corners and this establishes a preferred path for breakdown which, in turn, results in a very high current density in those corners. The high voltage from the input pad, coming through the metal, metal contact, down through the polycrystalline silicon (as it is used in the instant invention, see the description, infra) sees an N+ diffusion. This N+ diffusion is the first place where the high voltage is clamped by avalanche breakdown and it is the first place on the semiconductor chip where significant energy is dissipated. The side wall junction has a steeper gradient and thus a lower breakdown voltage than the bottom junction since the sides of the N+ diffusion touch a boron channel stop field implant.

In addition, there is an electric field enhancement by reason of the curvature of the perimeter of the junction. As the radius of the junction is reduced, the electric field becomes higher for the same input potential. With a rectangular diffusion shape, the junction has a three dimensional corner close to the bottom of the junction in the corner of the shape, and at that point the junction gradient is still higher than at the bottom or side of the N+ diffusion. This creates another preferred path for breakdown current during avalanche and practically all of the electrostatic discharge current goes through these corners. This results in the maximum safe current density being exceeded in the ensuing hot spot at a lower input potential.

SUMMARY OF THE INVENTION

It will be understood, then, that it must be an objective of good input network design to distribute current and thermal dissipation as evenly as possible over an area as large as possible. The problems described, above, and other problems are resolved in accordance with the instant invention by reducing hot spots; by distributing the current over a greater area (by increasing the effective avalanche device contact size, thus reducing current density without significantly increasing input capacitance for normal signals), by reducing the variation in resistance in the metal to silicon interface by interposing polycrystalline silicon between the metal and the monocrystalline silicon, by accurately aligning the aluminum surface contacts with the diffusion pattern and the buried contacts in the monocrystalline silicon, by avoiding nearby placements of other N+ diffusions, by using distributed field inversion avalanche devices, and by utilizing accurately rounded N+ diffusion without any convex corners and concentrically locating accurately rounded metal and buried contacts so that they are also concentric with respect to the diffusion pattern.

It is therefore an object of the invention to provide improved input protection to an MOS semiconductor circuit by reducing hot spots (preferred current paths) in the input circuit.

It is a further object of the invention to reduce hot spots in the input circuit of an MOS semiconductor device by increasing the area of the input contact in the avalanche protective device.

It is another object of the invention to reduce hot spots in the input circuit of an MOS semiconductor device by reducing the variation in resistance from the metal to the N+/P junction of the avalanche protective device and reducing the variation of Al-Si contact potential by depositing a polycrystalline silicon layer between the metal contact and the monocrystalline silicon of the device's diffusion layer.

It is a still further object of the invention to reduce hot spots in the input circuit of an MOS semiconductor device by accurately aligning (vertically) input aluminum surface contacts with buried contacts in the network's avalanche protective device.

It is still another object of the invention to provide improved input protection to an MOS semiconductor circuit by reducing hot spots in the input circuit by providing accurately rounded N+ diffusion and buried and metal contacts without any convex corners which would provide a preferred current path through the diffusion layer.

It is yet a further object of the invention to provide an improved input protection network by using a distributed avalanche semiconductor device.

It is yet a still further object of the invention to provide an improved input protection network by controlling the effects of a nearby diffusion layer and by providing such a diffusion layer in distributed form, keeping such diffusion at a closely controlled equal distance from the input protection diffusion.

These and other objects of the invention will be better understood upon study of the Detailed Description of the Invention, below, together with the drawings in which:

FIGS. 1A through 1F illustrate the geometry of the input network of the invention by means of a Calma style plot of the plan view of each of the layers of the network and wherein:

FIG. 1A is the N+ diffusion layer;
FIG. 1B is a polycrystalline silicon (poly) layer;
FIG. 1C is the poly to N+ diffusion (buried) contact;
FIG. 1D is another poly layer;
FIG. 1E is the aluminum to poly (metal) contact; and
FIG. 1F is the metal (aluminum) layer;
FIGS. 2A through 2F illustrate, cumulatively, the build up of the layers of FIGS. 1A through 1F, respectively, FIG. 2A being identical to FIG. 1A, FIG. 2B being the combination of the layers of FIGS. 1A and 1B, FIG. 2C being the accumulation of the layers of FIGS. 1A, 1B and 1C, etc.;
FIG. 3 is a cross section of an input metal to diffusion layer contact area of prior art circuits;
FIG. 4 is a cross section of the input circuit of the instant invention taken at 4—4 of FIG. 2F;
FIG. 5 is an isometric view of a metal contact/N+ diffusion area with a rectangular geometry;
FIG. 6 is illustrative of a round, non-concentric metal contact/N+ diffusion area;
FIG. 7 is illustrative of a round concentric metal contact/diffusion area according to the instant invention but with another nearby N+ diffusion area; and
FIG. 8 is a cross section taken at 8—8 of FIG. 2F.

DETAILED DESCRIPTION OF THE INVENTION

It should be understood that there are a number of features which are integrated portions of the invention, each of which contribute to an improved input protection network for an MOS semiconductor device. While each of these features contribute to the desired protective network, optimum results are obtained by implementing all of these features in a given semiconductor design. However, it should also be understood that each of the separate features contribute to one degree or another to input protection and that they may also be used individually or in any desired combination to reduce damage from electrostatic discharge to an MOS input gate electrode. The particular preferred embodiment taught herein utilizes all of the features of the invention.

Figures 1B, 2B:
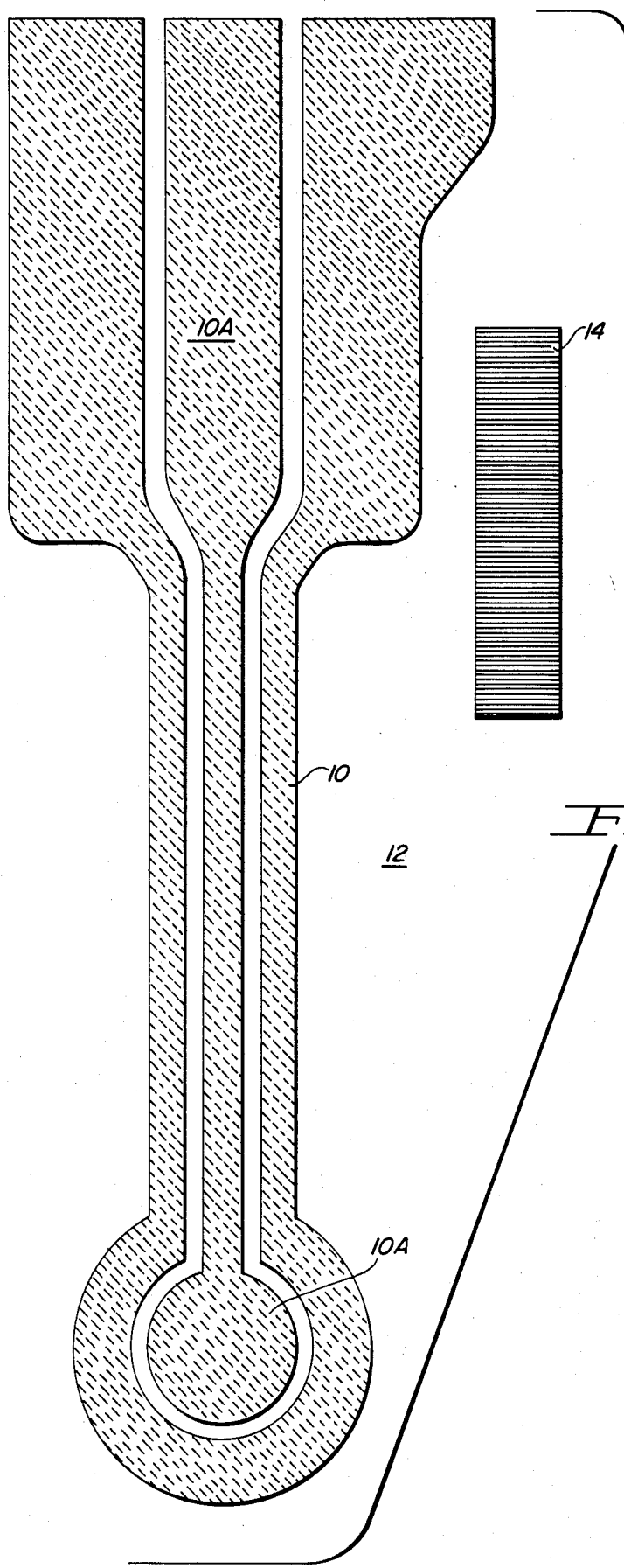
Figures 1C, 2C:
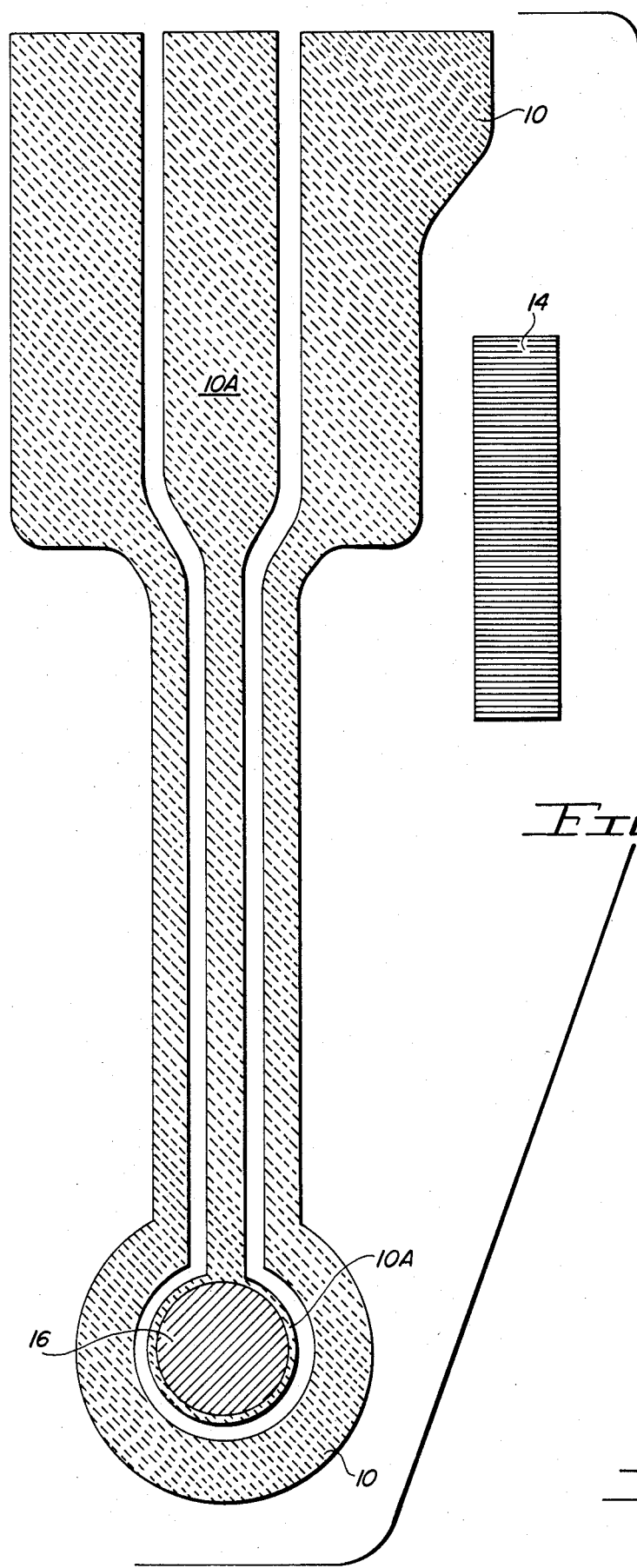
Figures 1D, 2D:
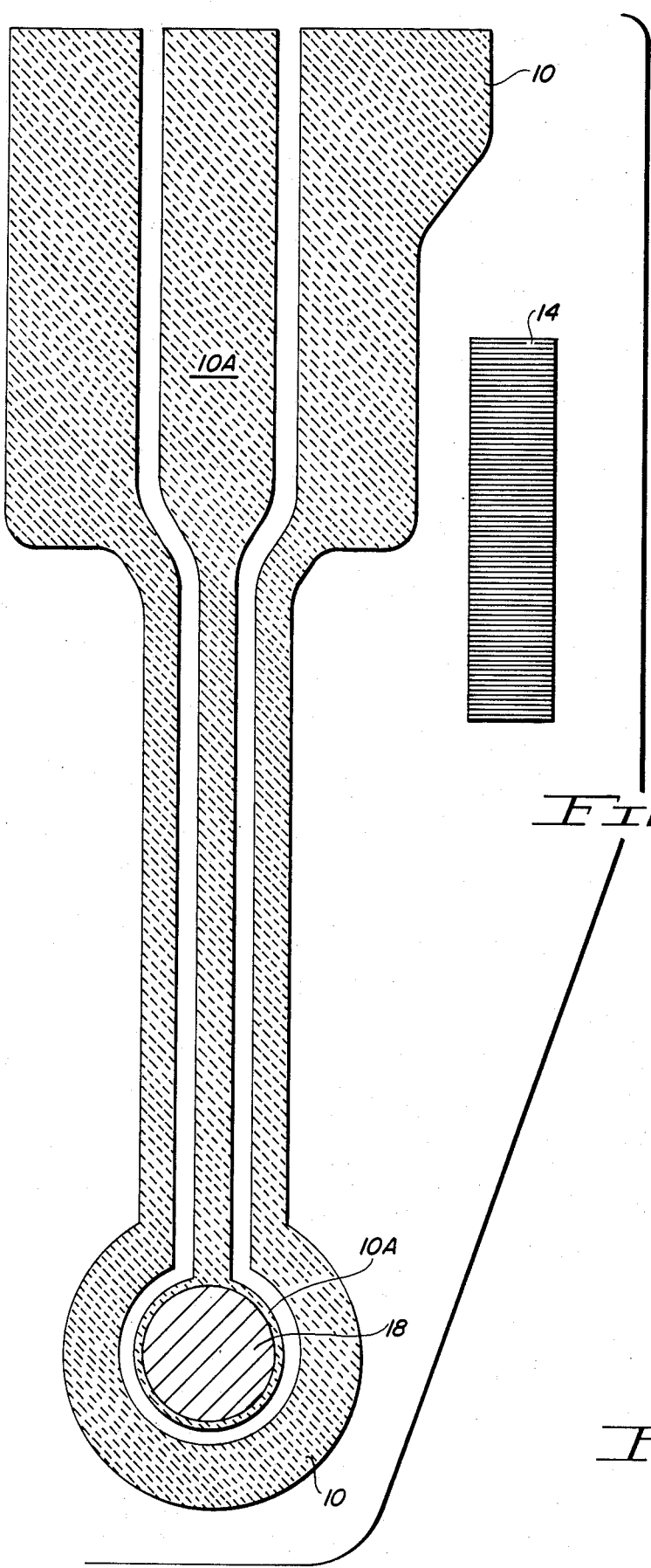
Figure 2F:
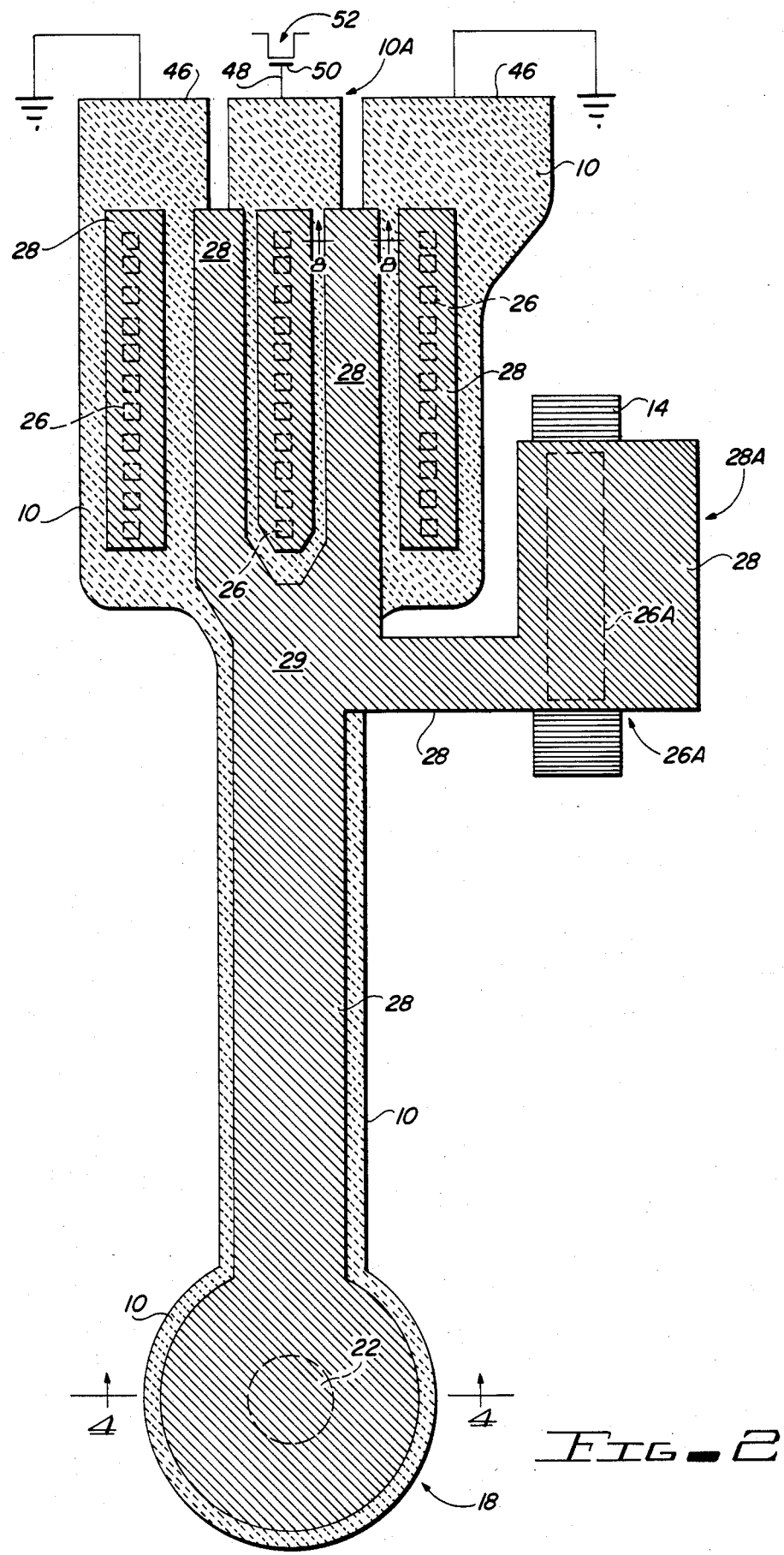

FIGS. 1A through 1F and 2A through 2F depict a Calma style machine plot of the various layers of the input protection network of the invention. FIGS. 1A and 2A are identical. FIG. 2B shows how the layers of FIGS. 1A and 1B are combined. FIG. 2C shows how the layers of FIGS. 1A, 1B and 1C are combined, etc. FIG. 2F illustrates the completed input network. It will be understood that the deposition process steps for silicon dioxide and glass are not shown in these Figures, but it will be well understood by one having ordinary skill in the semiconductor art that these depositions are interposed, as required, with those shown.

FIG. 1A is the N+ diffusion pattern 10 as first diffused in monocrystalline P— silicon substrate 12 in a well known way. A layer of SiO₂ (silicon dioxide) is then deposited (not shown in FIGS. 1-2, but see FIG. 4, reference numeral 11) over diffusion layer 10. FIG. 1B represents a first polycrystalline silicon layer 14 and it is shown in combination with the N+ diffusion layer 10 in FIG. 2B. Poly layer 14 may be on the order of 4,000 Angstroms in thickness.

FIG. 1C shows pattern 16 used to etch away silicon dioxide 11 (which was deposited prior to the poly) and the combination of the three layers of FIGS. 1A-1C are shown in FIG. 2C. The hole 16 in the silicon dioxide, shown in FIG. 1C, is used to make a buried contact between N+ diffusion layer 10A and poly 18, shown in FIGS. 1D and 2D. As may be seen in FIG. 4, a cross section of FIG. 2F taken at 4—4, poly 18 is larger in maximum diameter at the top than the lower portion thereof which forms the buried contact with diffusion layer 10A. It should also be noted that both the major and minor perimeters of poly 18 and diffusion layer 10A are round and made to be accurately concentric, each with the others.

Figure 1F:
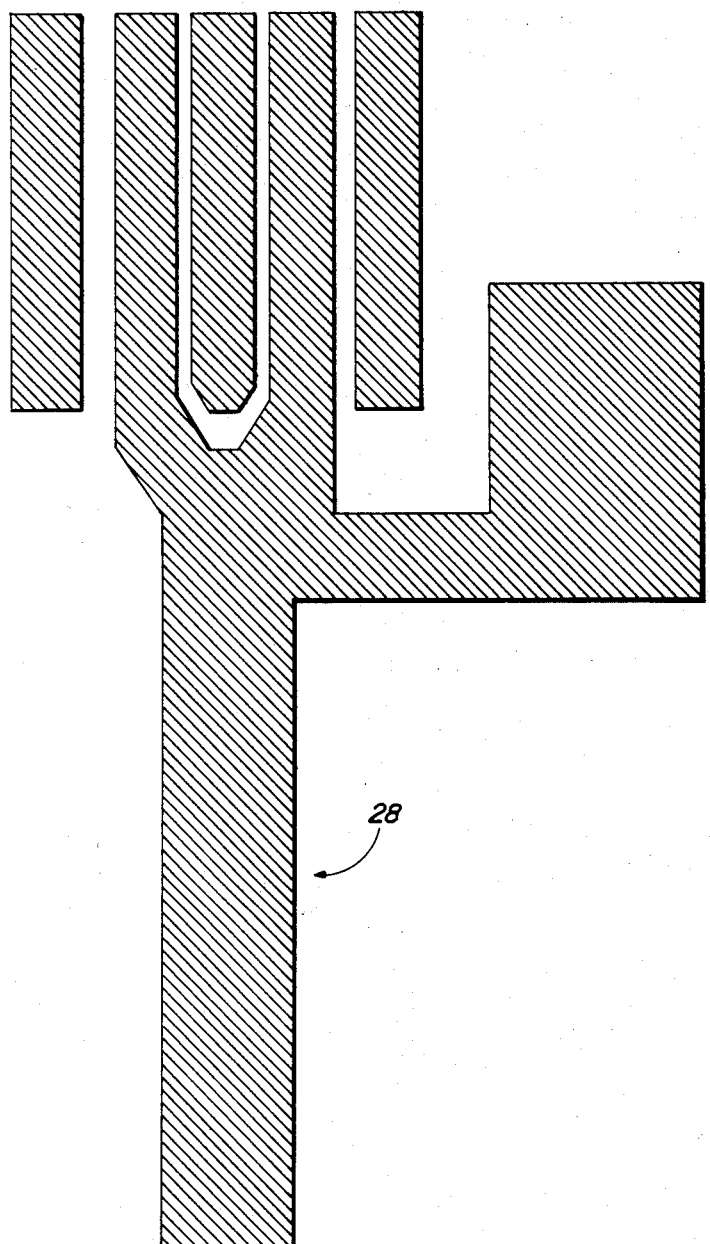
Figure 4:
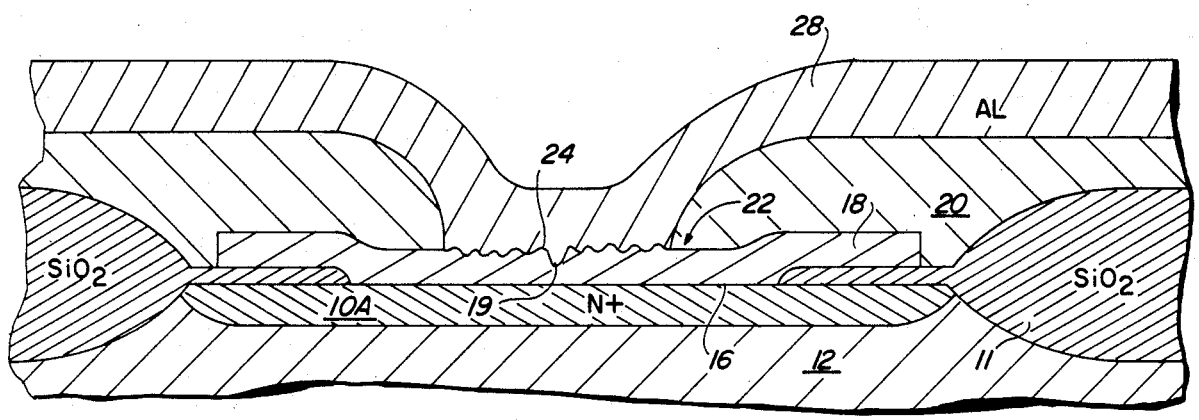

After poly layer 18 is deposited, glass 20, shown in FIG. 4 is deposited. FIG. 1E shows window 22 etched in glass 20 (shown there and also in FIG. 4) to allow formation of metal contact 24 (see FIG. 4) there through. The etched hole 22 configuration is shown in plan view in FIG. 2E. Windows 26 and 26A are etched at the same time. Finally, as shown in FIGS. 1F and 2F, metal layer 28 is deposited. Metal 28 makes contact with the underlying layers through windows 22, 26, and 26A wherever they occur. In all cases but one, this metal contact is with N+ diffusion layer 10. The exception is in that case where metal 28 contacts poly 14 through window 26a, see FIG. 2F.

Figure 3:
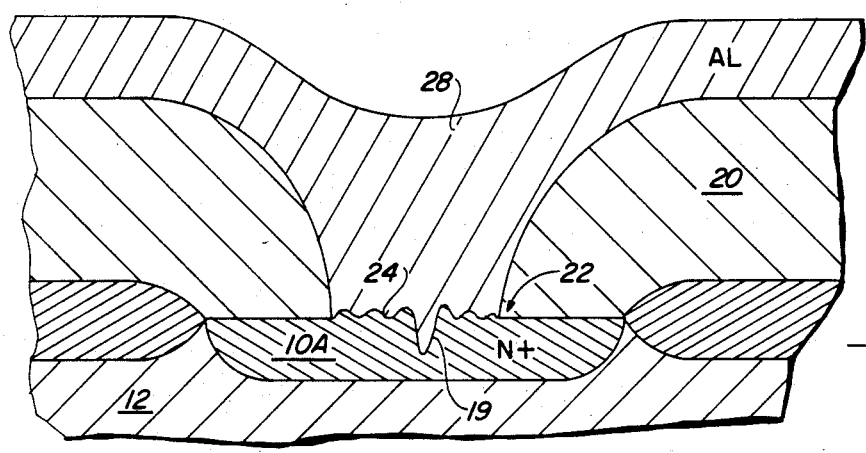

The structure of the input network of the invention may be still better understood by careful study of FIGS. 3 and 4. FIG. 3 is representative of the structure of a prior art device input circuit as it would be seen if it were a cross section taken at 4—4 of FIG. 2F. Metal (aluminum) 28 contacts N+ diffusion layer 10A directly through a window 22 in glass 20. Metal spike 19 extends a considerable distance down into diffusion layer 10A and represents a low resistance, preferred current path to substrate 12 which may cause avalanche breakdown in that N+ diffusion area 10A between metal 28 (at contact 24) and substrate 12.

FIG. 4 is illustrative of some of the improvements of the instant invention. Polycrystalline silicon layer 18 is interposed between metal 28 and N+ layer 10A.

The aforedescribed layering of the input network of FIG. 2F comprises a number of features which contribute to good electrostatic discharge resistance. In order to understand all of the features of the instant invention, it must first be understood how the input network is utilized in an integrated MOS circuit.

Referring to FIGS. 1F and 2F, a large metal input pad (not shown in FIGS. 1F and 2F) would be provided as a part of, and connected to, metal layer 28, at line 28A, for accepting a bond wire to the input pin of the packaged device. N+ diffusion layer 10A, at upper end of 10A, would extend to gate electrode 50 of an input gate transistor 52 of the device. Such upper extension of diffusion layer 10A might be beneath some metal layers, depending upon the general layout of the device in which it is applied. Of course, it will be understood that the electrostatic charge, which is the damage causing element under consideration, is applied through the input pin, then through the bonding wire to the input metal pad which is connected to line 28A. It is the purpose of the network of FIG. 2F to prevent that electrostatic discharge from damaging either input gate 50 or the protective network of FIG. 2F.

The purpose of poly layer 14, see FIG. 2F, which is disposed between substrate 12 and metal layer 28, is to act as a sacrificial layer. It "attracts" the spikes 19 of metal layer 28 by saturating the large metal area with silicon so that they do not occur in other locations of the circuit where they may be more damaging. Sacrificial poly layer 14 is located near line 28A because of the relatively large mass of metal represented by the input pad, not shown, but attached at line 28A.

It must now be noted that metal layer 28 is disposed over a large area of diffusion layer 10 and 10A. A comparison of the geometry of diffusion layer 10, 10A (FIG. 1A) and metal layer 28 (FIG. 1F) illustrates the diversity and extent of the overlap between those two layers, as does a careful inspection of FIG. 2F.

Referring now to both FIGS. 2F and 4 (which is a cross sectional representation of metal contact area 22 of FIG. 2F), it may be seen that metal 28 contact area 22 with polycrystalline silicon 18, together with N+ diffusion layer 10A beneath contact area 22, comprises an active semiconductor device which may be an avalanche mode diode or an NPN field inversion transistor. It is this semiconductor device which provides damage protection for the device input gate 50. As before stated, the broad and diverse spread of the metal/diffusion layer overlap assures a large area avalanche device which provides a high degree of damage protection by reducing the creation of hot spots in diffusion layer 10A by reducing current density.

Electromigration of aluminum is also a problem. It has been found that a crude measure of the maximum current density allowable in aluminum which still avoids electromigration is 64 amperes/square centimeter. This number is affected by other factors; the mean time before failure (MTBF) requirement and the absolute dimensions of the metal cross section. Hence, a metal contact with a diffusion layer must be larger than:

Area = Maximum Current/Maximum Current Density

= 2 Amp/2 × $10^6$ Amp/sq.cm.*

= 100 sq.microns (*See, supra, for source of the numerical values. Note, also, that a current density of 2 amperes was used in place of the 1.26 ampere figure stated above in order to afford a more conservative value, thus attempting to account for MTBF and metal cross section considerations.)

Metal 28 contact 24 (in window 22) is deposited on a layer of polycrystalline silicon (poly) 18. (See FIG. 4.) The interstitial space between and around metal layer 28, poly layer 18 and N+ diffusion layer 10A is $SiO_2$ 11 and/or glass 20, excellent electrical and thermal insulators. (FIG. 3 shows the prior art technique of deposition of metal layer 28 directly on monocrystalline N+ diffusion layer 10A.)

In FIG. 4 it may also be seen that this arrangement provides poly conductor 18, between metal layer 28 and N+ diffusion layer 10A. Because the depth of metal spike 19 represents a lower percentage of the total depth of poly layer 18 and diffusion layer 10A, combined, than the depth of metal spike 19 (in the prior art configuration of FIG. 3) in proportion to the depth of diffusion layer 10A, alone, the resistance of the preferred current path represents a smaller variation from that of FIG. 3. The presence of poly layer 18 provides a series resistor and a buried contact in N+ diffusion layer 10A. The relative variation in resistance in both the vertical and the lateral directions is much reduced below that of the direct metal/monocrystalline silicon interface of prior art networks, thus reducing hot spot problems because poly layer 18 adds significantly to the total series resistance in the breakdown path and the metal spikes produce a relatively smaller effect. With poly layer 18 between metal contact 24 and N+ diffusion layer 10A, current spiking would have to occur through much of poly layer 18 and through the entire N+ diffusion layer 10A before a short circuit could result.

The passage of current through poly layer 18 causes a power loss due to resistor heating; the resistor being poly layer 18. There is also an IR voltage drop in poly layer 18 which exposes the junction to a lower voltage. The power loss is dissipated in the form of heat, but the portion of poly layer 18 which is not in contact with N+ diffusion layer 10A is surrounded by silicon oxide 11 and glass 20, poor heat conductors. A poly resistor cannot dissipate much heat energy without danger of vaporization and any kind of a poly resistor in the input circuit which is not in good thermal contact with the substrate will act as a fusible link and disintegrate even at moderate current density levels. Therefore it is an important feature of the invention that poly layer 18 is in good thermal contact with N+ diffusion layer 10A, a good heat sink in combination with substrate 12.

Figure 6:
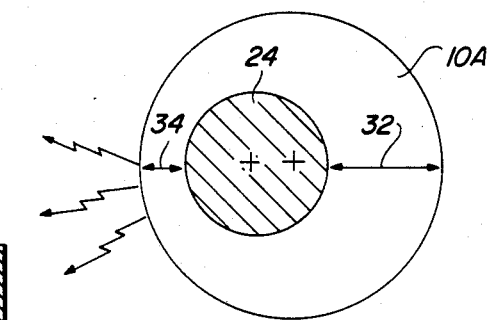

It is essential for optimum results to orient metal contact 24 so that it is accurately round and concentric with accurately round buried contact 16 in N+ diffusion layer 10A. It is also important to avoid convex portions in the geometry of any of the layers so that there are no short preferred paths from metal contact 24 to N+ diffusion layer 10A. This is illustrated in FIG. 6 wherein the effect of an off-center pattern is shown. The difference in the dimensions shown at reference numerals 32 and 34 represents a differential resistance on the two paths from contact 24 to the edge or perimeter of diffusion layer 10A. That differential makes path 34 a preferred (low resistance) current path. True concentricity eliminates that preference. In practice, if the differential is not more than ten percent of the minimum path resistance, it is of practical insignificance.

Furthermore, it is advantageous to make the diffusion layer 10A circle significantly larger than the contact 24 diameter. It is, as explained, supra, the ratio between the difference of the two circle radii and the potential misalignment which is controlling. The larger the difference, the larger the misalignment which may be tolerated.

Figure 5:
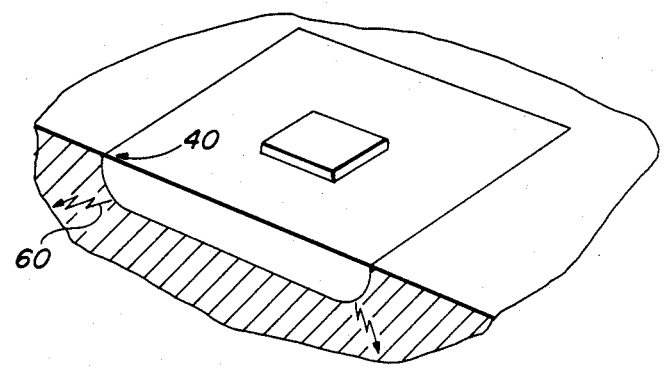

The round junction head configuration shown in FIG. 2F, and elsewhere, is important to the good distribution of current flow upon impact of the network by an electrostatic charge. As noted, supra, square corners 40 (See FIG. 5) invite high current density concentrations in those corners; hence a lower potential is required to cause breakdown at 60. By using the perfectly rounded configuration of FIG. 2F, for example, the concentration which would occur in a square cornered version is distributed evenly along the entire perimeter of the round shape, avoiding the hot spots which are inherent to the rectangular configuration.

Figure 7:
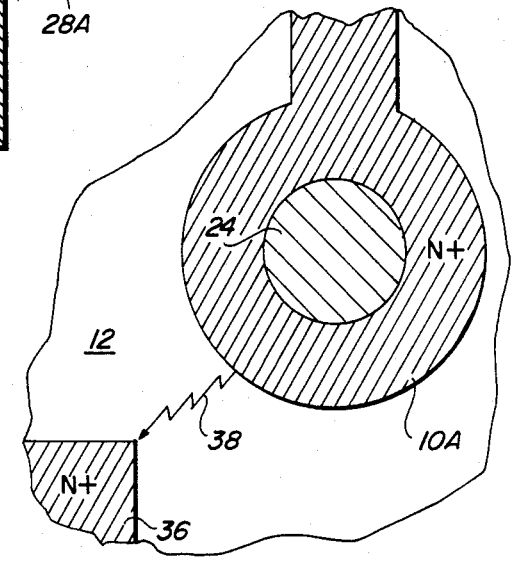

Referring now to FIG. 7, it is seen that a nearby unrelated N+ diffusion 36 is depicted in proximity to N+ diffusion 10. It must be noted that the peak ESD current is on the order of amperes. At such high avalanche currents, so many holes are injected into substrate 12 close to the surface that even with very poor collection efficiency, any unrelated N+ diffusion 36 in close proximity to the junction diffusion 10A can act as a collector for a bipolar NPN transistor made up of the round input protection N+ diffusion 10A as collector or emitter (depending upon the polarity of the applied ESD), substrate 12 at the surface, as the base, and the unrelated diffusion 36, as emitter or collector, respectively. (During ESD testing it may be assumed that all diffusions are grounded.)

If the avalanche multiplication factor, M, times the transport factor, alpha, becomes larger than unity, the ESD current will see a negative resistance and the current is limited only by the external test resistance. In general, if there is any unrelated diffusion 36 within about 20 to 70 microns distance from protection network N+ diffusion 10A, depending upon the substrate current, the bipolar NPN transistor between those diffusions is turned on and establishes an undesirable preferred current path or hot spot 38. It is very space consuming to keep all unrelated diffusions away from every input protection diffusion by more than 20 to 70 microns. While the bipolar transistor action is not in and of itself damaging, the fact that it occurs in a narrow path, which is the shortest distance between the diffusions, may be damaging.

It is possible to use this usually undesirable bipolar transistor to advantage as a part of the protection network. Refer to FIG. 1A. If it is arranged as an annular diffusion 42 (a portion of N+ diffusion (o)), concentric and surrounding the protection diffusion 10A, it can be assured that it will not create an undesirable hot spot. The spacing 44 must be such that the transistor does not conduct at normal operating levels so that the N+ diffusions 10A, 42 remain isolated from each other under those conditions. Since the annular unrelated diffusion 42 is derived from the same mask (and layer) as the input protection diffusion 10A, it may be made precisely concentric without any registration problems. The spacing is the same everywhere and the current is very evenly distributed when breakdown occurs. It may be seen in FIG. 1A that the annular diffusion is not perfectly round in the preferred embodiment of the invention, but rather, covers most of the perimeter of the round protection diffusion layer which underlies the metal contact and then parallels the long central diffusion run of the protection circuit, thereby keeping an equadistant spacing everywhere from the input protection diffusion path. This distributed bipolar NPN transistor assures even distribution of breakdown current everywhere, avoiding hot spots and reducing current density to manageable levels; which means that the protection circuit is allowed to recover its high resistance characteristics after breakdown. What has heretofore been referred to as an "unrelated diffusion" may now be referred to as a "guardring" and it becomes a positive deterrent to damage.

The effectiveness of guardring 42 is enhanced by employing a series resistance between it and ground. This is accomplished inherently because guardring 42 is itself a distributed resistance. At points 46 (FIG. 2F), it is connected (not shown) to Vss which is ground. The series resistance to ground provides a voltage drop in that resistance during breakdown so that the guardring rises to the breakdown voltage. There is energy dissipation in that resistance, due to the IR drop, as well as along the perimeter and bottom of the N+ guardring 42 due to avalanche breakdown there. The same IR drop occurs in the N+ diffusion 10A going 48 to the input gate 50, but gate 50 connected diffusion is protected by a voltage clamping circuit which will be discussed, supra, so that gate 50 is protected from overvoltage.

If every horizontal segment 54 of the length of the three long diffusions (most easily seen in FIG. 1A) is considered to be a separate elemental bipolar transistor, having its own collector, base and emitter, the sum of the collector and emitter resistance is constant with base current injected by a current source avalanche injection. This forces the area between the resistors to dissipate energy.

To this point all discussion has been directed to dissipation of ESD energy as evenly as possible over an area and volume as large as possible in order to reduce the specific current/energy density. This serves to prevent the input protection network of the invention from being damaged under ESD stress. The remaining concern is with the protection of input gate 50 of FET 52, the input transistor of the IC being protected See FIG. 2F. The gate insulating oxide rupture voltage is usually in the range of from 40 to 50 volts. In contrast with junction avalanche breakdown, which is not permanently damaged unless excessive heat is generated per unit volume, the gate oxide will be permanently damaged by any current flow through it. Even under very controlled current limiting conditions, in which the gate current is limited to miniscule amounts and the gate does not completely rupture, the reliability of the gate oxide insulator is compromised by the existence of trapped charges within the oxide; a permanent voltage stress results.

To be most effective, the best location for a gate voltage clamp is right at gate 50, as far down circuit on the series resistance of diffusion layer 10A as possible. The gate capacitance and the series diffusion resistor comprise a low pass filter at the gate which integrates and attenuates very short discharge pulses at the physical gate input point. The series resistor must limit the maximum current through the voltage clamp to safe levels.

The most often used voltage clamp (not shown) is an enhancement mode transistor with its drain connected to the gate to be protected and its source and gate grounded. The grounded gate provides for a drain breakdown voltage which is lower than the usual N+ junction breakdown voltage. If the breakdown current is high enough, a bipolar transistor, comprising N+ source as emitter, the P— substrate surface as the base and the N+ drain as the collector, will turn on providing a snapback effect. With negative input voltages, the voltage is clamped by the N+/P diode to a voltage on the order of one volt. The enhancement transistor in parallel will turn on under about the same conditions. However, such voltage clamping requires that a solid Vss (ground) metal line be nearby.

Figure 8:
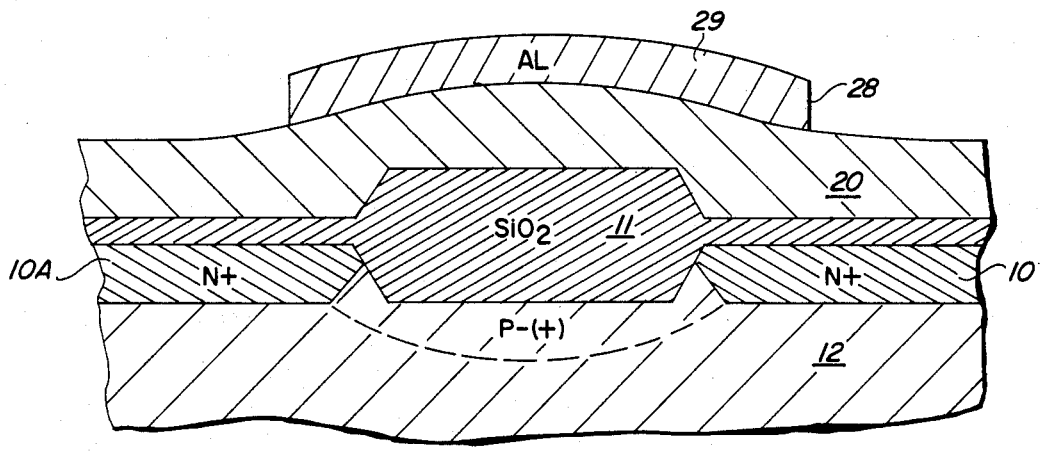

In the case where only a Vcc (power supply) line is nearby, a different approach to voltage clamping must be used. It must be noted that during ESD, the device is not powered up and Vcc is as much a path to ground as is Vss. Referring to FIG. 8, a cross-section of FIG. 2F, the voltage clamping device may be a metal or poly inversion field transistor with the gate 29 being the input metal 28, the source 10 being Vss or Vcc and the drain 10A being the diffusion at the end of the input resistor. The metal field inversion threshold is approximately 30 to 35 volts. As the input voltage is increased, the stronger this clamping transistor turns on so that, at higher input voltages, the clamped voltage at the gate 50 of the input transistor 52 is even lower than at lower input voltages. The "on" resistance of the field inversion transistor (FIG. 8) is a square law function of the input voltage but the load, or series, resistance is constant. Rather than provide the field inversion transistor (FIG. 8) only at the end of the series resistor, it may be, and preferably, is extended all the way to the input diffusion. In addition to the field inversion transistor, when input node 10A goes above breakdown voltage a bipolar transistor is formed: N+, collector 10A; P−(+) portion of substrate 12 base; and N+ emitter 10. Any breakdown current at the end of collector 10A is also the base current of the lateral NPN transistor. It is not completely known at this time which mechanism contributes the majority of the conduction from the annular input diffusion to the concentric guardring during ESD, but it is believed that the greatest contribution comes from the lateral bipolar transistor. In any case, the overlap of the spacer field between the input diffusion and the grounded guardring does not adversely affect the current dissipation of ESD and under some time/voltage conditions, it is expected that it also contributes a share of the protection.

While the invention has been particularly shown and described herein with reference to preferred and other embodiments thereof, it will be understood by those skilled in the art that various modifications and changes may be made to the instant invention utilizing the principles of the invention as described herein without departing from the spirit and scope thereof as encompassed in the accompanying claims. Therefore, it is intended in the accompanying claims to cover all such equivalent variations as come within the scope of the invention as described.

What is claimed is:

1. An improved input protection network for reducing the damaging effect of an electrostatic discharge into at least one input gate electrode of an MOS semiconductor chip, the MOS device having at least one input circuit pad electrically connected to the gate electrode, the improvement lying in higher ESD voltage or energy damage resistance by reduction of hot spots and the ensuing excessively high current density in the network caused by excessive current flow or thermal rise, the improvement comprising:
    means for providing a series resistance between the at least one input pad and the at least one input gate electrode, said series resistance means further comprising:
    a plurality of accurately round and concentric layers, said plurality of layers including, at least, in an order of layers from top to bottom, an accurately round and concentric metal contact layer and an accurately round and concentric bottom diffusion layer, said accurate concentricity being mutually existent between each of said plurality of layers, said concentricity being within ten percent, said bottom diffusion layer being a portion of said series resistance, each of said plurality of accurately round and concentric layers, from top to bottom, except said bottom diffusion layer, having a contact upon one of said accurately round and concentric layers lying therebelow.

2. The improved input protection network according to claim 1 wherein said plurality of accurately round and concentric layers further comprises:
    a single buried contact polycrystalline layer, said buried contact being located between said metal contact layer and said diffusion layer.

3. The improved input protection network according to claim 1 wherein at least a portion of said means for providing a series resistance is a multiple diffusion run comprising:
    a first diffusion run having an end and two elongated sides, said first diffusion run lying in a plane; and
    a second diffusion run, said second diffusion run lying in said plane of said first diffusion run, said second diffusion run having generally a "U" shape with two ends, said second diffusion run being evenly spaced away from and enclosing said first diffusion run on said two elongated sides and on said end, said second diffusion run being grounded at each of said two ends.

4. The improved input protection network according to claim 2 wherein at least a portion of said means for providing a series resistance is a multiple diffusion run comprising:
    a first diffusion run having an end and two elongated sides, said first diffusion run lying in a plane; and
    a second diffusion run, said second diffusion run lying in said plane of said first diffusion run, said second diffusion run having generally a "U" shape with two ends, said second diffusion run being evenly spaced away from and enclosing said first diffusion run on said two elongated sides and on said end, said second diffusion run being grounded at each of said two ends.

5. An improved input protection network for reducing the damaging effect of an electrostatic discharge into at least one input gate electrode of an MOS semiconductor chip, the MOS device having at least one input circuit pad electrically connected to the gate electrode, the improvement lying in higher ESD voltage or energy damage resistance by reduction of hot spots and the ensuing excessively high current density in the network caused by excessive current flow or thermal rise, the improvement comprising:
    means for providing a series resistance between the at least one input pad and the at least one input gate electrode, said series resistance means further comprising:
    a plurality of accurately round and concentric layers, said plurality of layers including, at least, in an order of layers from top to bottom, an accurately round and concentric metal contact layer and an accurately round and concentric bottom diffusion layer, said accurate concentricity being mutually existent between each of said plurality of layers, said concentricity being within ten percent, said bottom diffusion layer being a portion of said series resistance, each of said plurality of accurately round and concentric layers, from top to bottom, except said bottom diffusion layer, having a contact upon one of said accurately round and concentric layers lying therebelow, wherein at least a portion of said means for providing a series resistance is a multiple diffusion run comprising:
    a first diffusion run having an end and two elongated sides, said first diffusion run lying in a plane; and
    a second diffusion run, said second diffusion run lying in said plane of said first diffusion run, said second diffusion run having generally a "U" shape with two ends, said second diffusion run being evenly spaced away from and enclosing said first diffusion run on said two elongated sides and on said end, said second diffusion run being grounded at each of said two ends.

6. The improved input protection network according to claim 5 wherein said plurality of accurately round and concentric layers further comprises:
    a single buried contact polycrystalline layer, said buried contact being located between said metal contact layer and said diffusion layer.

* * * * *